(12) United States Patent
Levine et al.

(10) Patent No.: US 6,228,744 B1
(45) Date of Patent: May 8, 2001

(54) MANUFACTURING METHODS AND USES FOR MICRO PIPE SYSTEMS

(75) Inventors: Ernest Norman Levine, Poughkeepsie; Michael Francis Lofaro, Milton, both of NY (US); James Gardner Ryan, Newtown, CT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/427,898

(22) Filed: Oct. 27, 1999

Related U.S. Application Data

(62) Division of application No. 08/808,927, filed on Feb. 28, 1997, now Pat. No. 6,031,286.

(51) Int. Cl.[7] .................................................. H01L 21/76
(52) U.S. Cl. .......................................... 438/422; 257/714
(58) Field of Search .................................... 257/622, 714, 257/716; 438/422

(56) References Cited

U.S. PATENT DOCUMENTS

| | | | |
|---|---|---|---|
| 4,079,410 | 3/1978 | Schiertz | 257/714 |
| 4,138,692 | 2/1979 | Meeker et al. | 257/697 |
| 5,051,814 | 9/1991 | Paal | 257/714 |
| 5,057,908 | 10/1991 | Weber | 257/714 |
| 5,099,311 | 3/1992 | Bonde et al. | 165/80.4 |
| 5,119,164 | 6/1992 | Sliwa, Jr. et al. | 257/776 |
| 5,179,043 | 1/1993 | Weichold et al. | 438/584 |
| 5,192,715 | 3/1993 | Sliwa, Jr. et al. | 438/631 |
| 5,278,103 | 1/1994 | Mallon et al. | 438/632 |
| 5,309,457 | 5/1994 | Minch | 372/34 |
| 5,508,234 | 4/1996 | Dusablon, Sr. et al. | 216/2 |
| 5,514,832 | 5/1996 | Dusablon, Sr. et al. | 174/15.1 |
| 5,592,024 | 1/1997 | Aoyama et al. | 257/751 |
| 5,598,632 | 2/1997 | Camarda et al. | 29/890.032 |
| 5,682,943 | 11/1997 | Yao et al. | 165/104.21 |

FOREIGN PATENT DOCUMENTS

04333571A * 11/1992 (JP) ...................................... 427/588

OTHER PUBLICATIONS

S. Wolf, Silicon Processing for the VLSI Era, (Lattice Press, California, 1990), vol. 2, pp. 211, 220–229, 238–239.*

* cited by examiner

Primary Examiner—Richard Elms
Assistant Examiner—Christian D. Wilson
(74) Attorney, Agent, or Firm—Scully, Scott, Murphy & Presser; Tiffany L. Townsend, Esq.

(57) ABSTRACT

A semiconductor device or other suitable substrate and method with single or multi layers of buried micro pipes are disclosed. This is achieved by controlling the aspect ratio of trenches as well as controlling the deposition characteristics of the material used to fill the trenches. A buried micro pipe is formed by filling a trench that has a height which is larger than a width thereof, so that the trench filler material lines sidewalls and bottom of the trench, and covers the top of the trench to form the micro pipe within the trench. Another layer can be formed over the filler material and planarized. Alternatively, the filler material itself can be planarized. Forming trenches in the planarized layer, and repeating the above steps forms a second set of buried micro pipes in these new trenches. This forms a semiconductor device having multiple layer of buried micro pipes. Via holes may be etched to contact a micro pipe, or to inter connect micro pipes buried at different levels Thus, instead of eliminating defective voids in trenches, the voids are controlled to form the micro pipes, which may be used to circulate a cooling fluid, or lined with a conductive material to form a micro light pipe channel, or buried conductive pipes.

12 Claims, 3 Drawing Sheets

MANUFACTURING METHODS AND USES FOR MICRO PIPE SYSTEMS

RELATED APPLICATIONS

This application is a divisional of U.S. application Ser. No. 08/808,927, filed Feb. 28, 1997, now U.S. Pat. No. 6,031,286.

BACKGROUND OF THE INVENTION

1. Field of the Invention

The present invention relates to a semiconductor or other applicable substrate having micro pipes and a method for forming thereof, and more particularly, to a semiconductor structure or other suitable substrate with single or multi layers of micro pipes and a method of forming thereof 2. Discussion of the Prior Art Chip manufacturing often requires etching trenches in various material. After trench etching, the trenches may be filled with a desirable material. In chip fabrication processes that involve filling trenches, voids are sometimes formed in the material that fills the trenches. The voids are generally considered defects.

SUMMARY OF THE INVENTION

The invention utilizes the voids in a positive manner to create controlled micro channel structures, either in a semiconductor device, or any other applicable substrate. The inventive micro pipe system, which can be interconnected using vias, can be used for cooling substrates or semiconductor devices. Alternatively, the micro pipes can be used as channels for fluid control and movement.

The object of the present invention is to provide a semiconductor or other suitable substrate having single or multi layers of micro pipes and a method for forming thereof.

Another object of the present invention is to form controlled voids that act as micro pipes.

Yet another object of the present invention is to provide a structure used for several applications, such as internal cooling of semiconductor devices.

Instead of eliminating voids in material used to fill trenches, the voids are controlled to form micro pipes. This is achieved by controlling the aspect ratio of the trenches and subsequent deposition characteristics. In one embodiment, a method of forming a micro pipe comprises the steps of forming a trench in a first layer of the semiconductor device, or other suitable substrate; and forming a second layer over the first layer The trench has a height which is larger than a width thereof so that the second layer lines sidewalls and bottom of the trench, and covers the top of the trench to form the micro pipe within the trench.

Illustratively, the trench is formed by reactive ion etching, and the second layer is formed by chemical vapor deposition (CVD) or plasma enhanced chemical vapor deposition (PECVD).

Yet another embodiment includes forming in the second layer a via hole that reaches the micro pipe. The second layer may be planarized by chemical mechanical polish or reactive ion etching prior to via hole formation. In another embodiment, using the via holes, a third layer is formed on inner surfaces of the micro pipe, by CVD for example.

A further embodiment includes forming a third layer on the second layer; forming another trench in the third layer; and forming a fourth layer on the third layer. The fourth layer has another micro pipe in the other trench formed in the third layer. The fourth layer may include a via hole that reaches the other micro pipe formed in the fourth layer. Another via hole formed through the second, third, and fourth layers reaches the micro pipes in the second and fourth layers. Illustratively, the other micro pipe in the fourth layer is perpendicular to the micro pipe in the second layer. Alternatively, the trench of the second micro pipe system may be formed in the second layer if it is thick enough. In this case, it is in the third layer, rather than in the fourth layer, where the second set of micro pipes are formed.

One or a series of micro pipes may be formed in a single layer. Alternatively, a multi layer network of micro pipes may be formed. Micro pipes of different levels may be interconnected as desired using via holes. One or more via holes may be etched to contact a micro pipe at any desired location, and to interconnect micro pipes of different levels.

The inventive method is cost effective and may be used to cool a microchip, or other substrates, by circulating a cooling fluid in the micro pipes.

In another embodiment, the micro pipes are lined with a desired material. In the case where the lining material is conductive, the pipes may be used as micro light pipe channels or buried conducting pipes. The lining of the pipes is achieved using CVD, for example. Access to line the micro pipes may be gained from the via holes. Alternatively, the micro pipes may be accessed from their sides, which are exposed after cutting the substrate into individual devices The micro pipe forming steps may be repeated to form as many desired layers of micro pipes. In addition, the micro pipe liner forming step may be repeated using different material to form a composite liner lining the inner surface of the micro pipe.

In yet another embodiment of the present invention, a semiconductor device or other suitable substrate comprises a first layer having a trench; and a second layer formed over the first layer, where the trench has a height which is larger than a width thereof, so that the second layer lines sidewalls and bottom of the trench and covers a top of the trench to form a micro pipe within the trench. The semiconductor device may have multi layers, each having one or a series of micro pipes therein. The inner surfaces of the micro pipes may be lined with a desired material, which may be conductive for example. Via holes in the various layers interconnect the micro pipes of different layers, or provides access to the micro pipes.

BRIEF DESCRIPTION OF THE DRAWINGS

Further features and advantages of the invention will become more readily apparent from a consideration of the following detailed description set forth with reference to the accompanying drawings, which specify and show preferred embodiments of the invention, wherein like elements are designated by identical references throughout the drawings; and in which.

DETAILED DESCRIPTION OF THE INVENTION

Chemical vapor deposition (CVD) and plasma enhanced CVD (PECVD) processes in semiconductor manufacturing, when used to fill a trench, may leave a central non filled hole. The characteristics of this hole, such as size and shape, are dependent on the aspect ratio of trench, and the deposition characteristics of the CVD or PECVD film being deposited. The aspect ratio (H/L) is defined as the ratio of the height (H) of the trench over its width (W).

Figure 2:
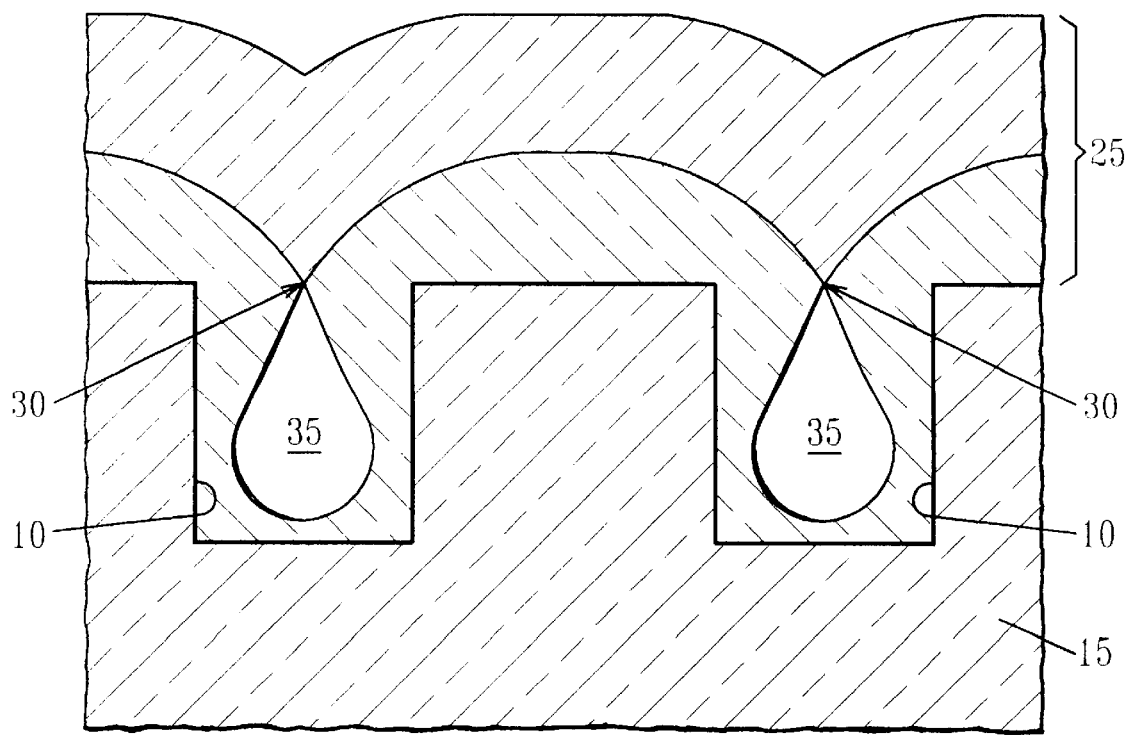
FIG. 2 shows a cross section along the line 2–2' of the structure of FIG. 1 with micro pipes formed in trenches according to the present invention.

The deposition characteristics refers to the degree which a film coats the walls of a trench, e.g., evenly or unevenly, as the trench walls are coated from top to bottom. If the film coats to the same degree all the trench surfaces, i.e., the top, sides, and bottom of the trench, a void is generally not formed. However, if the deposition characteristics or deposition process is suitably adjusted to coat more near the upper portion of the trench side wall than the lower portion thereof, then a structure with a micro channel, such as shown in FIG. 2, is achieved. There are multiple ways to achieve such a structure that include, for example, adjustment of the aspect ratio and/or adjustment of the deposition process or characteristics.

Figure 1:
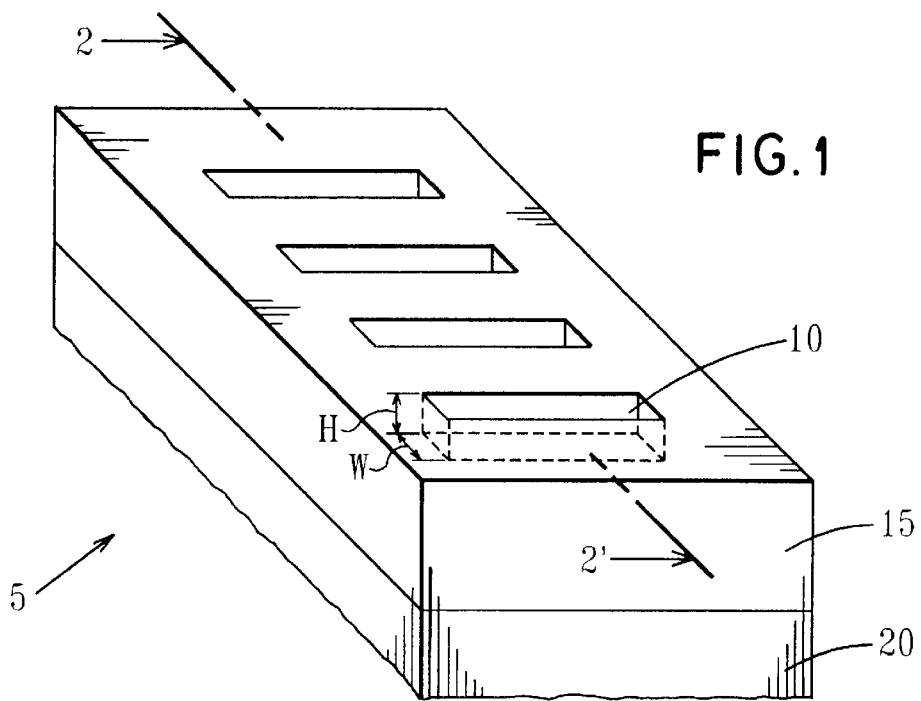
FIG. 1 shows a structure having trenches according to the present invention.

As shown in FIG. 1, a suitable substrate, such as a semiconductor device or chip 5, has at least one trench 10 formed in a material 15, which may be metal, insulator, or semiconductor for example. Illustratively the trench 10 is formed by reactive ion etching (RIE) of a thick oxide layer, such as a silicon oxide $SiO_2$ layer 15.

Figure 3:
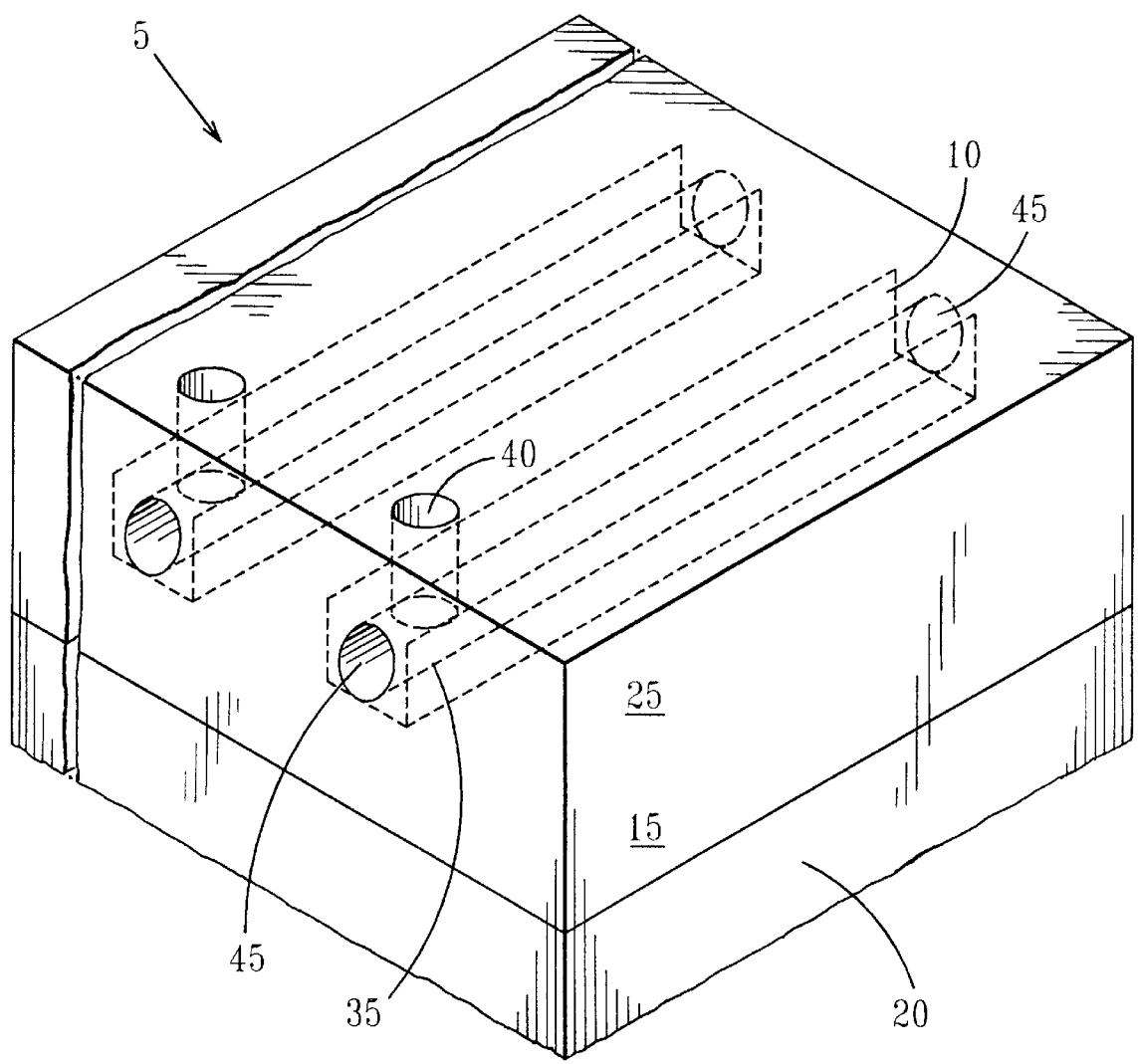
FIG. 3 shows a perspective view of a structure device having via holes to contact buried micro pipes according to the present invention.
Figure 4:
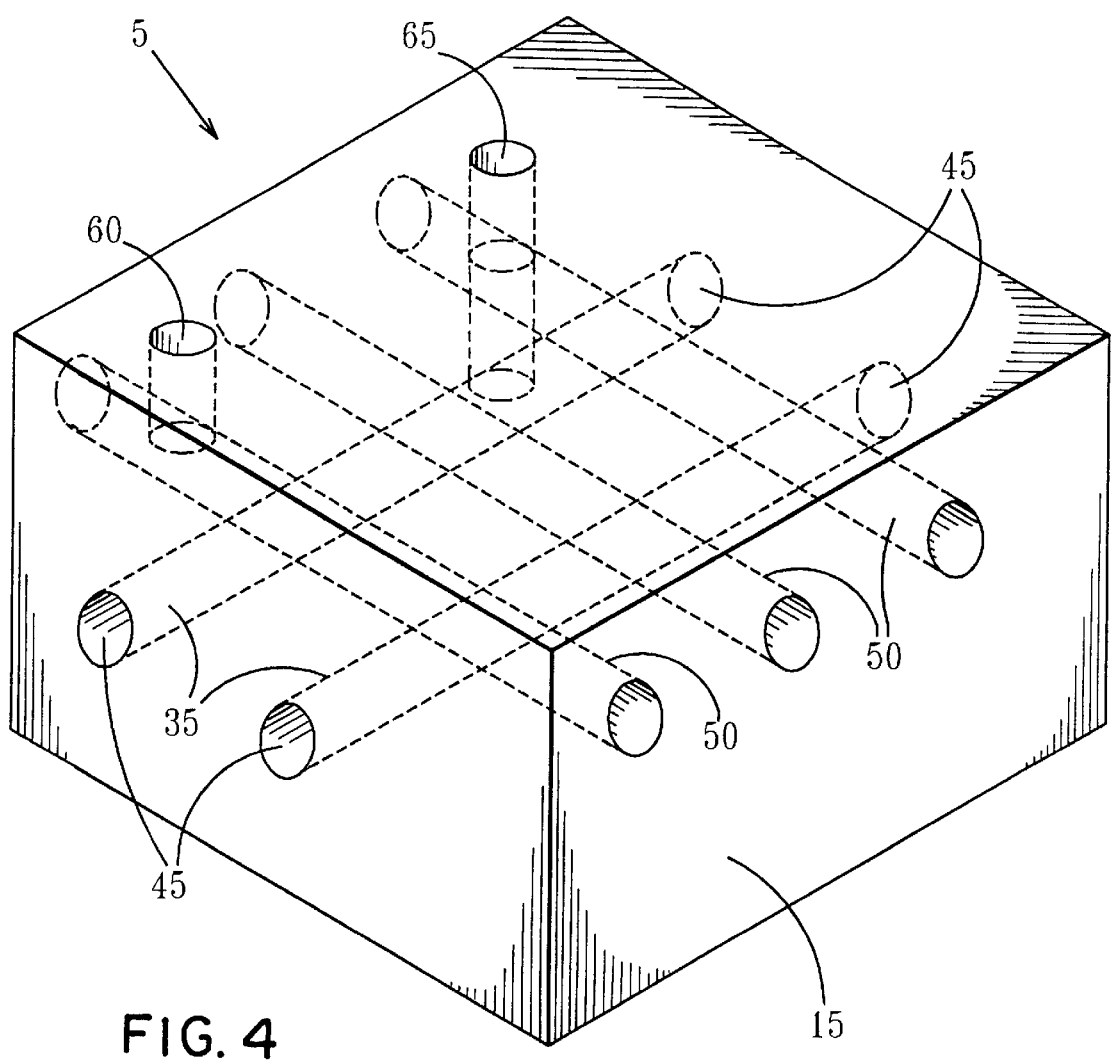
FIG. 4 shows a perspective view of a structure having multi layers of buried micro pipes contacted or inter connected by via holes according to the present invention.

The oxide layer 15 may be formed over a semiconductor material 20, such as silicon or any other chosen substrate. As shown in FIGS. 3–4, each trench 10 (FIG. 3) and micro pipe 35 (FIGS. 3–4) formed therein, may traverse the entire oxide layer 15. Alternatively, as shown in FIG. 1, each trench 10 may be confined within the oxide layer 15. In the case where the trenches 10 traverse the entire oxide layer 15, the buried micro pipes to be formed therein are accessible laterally from the sides of the oxide layer 15.

The trenches 10 are etched using conventional photo resist or other masking processes. By forming trenches 10 that have a large aspect ratio (H/W), in combination a CVD or PECVD layer having an appropriate deposition characteristics, a uniform desired hole or micro pipe is formed.

As shown in FIG. 2, which is a cross section along the line 2–2' of FIG. 1, the trenches 10 are filled with $SiO_2$ filler 25 using CVD or PECVD. The $SiO_2$ filler 25 lines the sidewalls and bottom of each trench 10. The aspect ratio of the trench is chosen so that the $SiO_2$ filler 25 that lines the upper sidewall portions of the trench 10 meet at a pinch off point referenced by numeral 30 in FIG. 2. Illustratively the aspect ratio (H/W) is ⅔. This forms a micro pipe 35 in each trench 10, where the micro pipe 35 is buried in the trench 10.

The size of the chip, substrate, micro pipe and pipe configuration are arbitrary. Depending on application, any material may be formed in the trench 10.

The aspect ratio of the trench 10 and the deposition characteristics of the material 25 deposited in the trench 10 control the location of the pipe 35. The thickness of the filler material 25 may be large. Illustratively, the thickness of the filler material 25 is approximately 10 microns. However, if smaller trenches are formed, then the thickness of the filler material 25 may be less than 10 microns. Alternatively, the filler material thickness may be more than 10 microns if desired. The thickness of the filler material 25 is sufficient to allow burial of the micro pipe 35 deep within the filler material 25. The large thickness of the filler material 25 also allows planarization thereof if desired.

Planarization may be accomplished by a chemical mechanical polish, or a planarizing RIE step.

As shown in FIG. 3, the micro pipe 35 may be contacted by forming a via hole 40 in the filler material 25, e.g., by etching. In the illustrative example shown in FIG. 3, the contacts or via holes 40 are formed near the edge of the chip 5. However, the via holes may be located anywhere on the chip or substrates 5. In addition, more then one via hole 40 may be formed for each micro pipe 35. The via holes 40 may be formed using a similar etching process that forms the trenches 10, e.g., by a conventional photo resist and an etching process.

The micro pipes 35 may extend through the entire length of the structure 5. This provides access to the micro pipes 35 via the lateral ends 45 thereof, which access is in addition to the access provided by the via holes 40. Such micro pipe access via the lateral ends 45 may be provided by a suitable dicing or cutting method of the substrate or chip 5.

FIG. 3 shows the chip 5 after the filler material 25 is planarized. Note, because the filler material 25 and the underlying material are both silicon oxide in this illustrative embodiment, a single layer is shown above the substrate 20, where the lower portion is referenced by numeral 15, which indicates the original $SiO_2$ layer, and the upper portion is referenced by numeral 25, which is the $SiO_2$ CVD or PECVD filler.

After planarizing the top of the filler material 25, a second layer having a micro pipe or a set of micro pipes may be formed using a similar process. As shown in FIG. 4, the second set of micro pipes 50 are formed over the first planarized layer having the first set of micro pipes 35. The top micro pipes 50 are formed by repeating the steps that formed the lower micro pipes. That is, trenches having a desired aspect ratio are etched in the planarized filler 25 (FIG. 3). Next, a second filler material is formed, by CVD or PECVD for example, to line the newly formed trenches and to form the second set of micro pipes 50.

Again if desired, the second filler material may be planarized and the process repeated to form additional layers having micro pipes buried therein.

Via holes 60 are etched in the second filler material to contact the second set of micro pipes 50. In addition, via holes, such as via hole 65 shown in FIG. 4, may be formed to interconnect the micro pipes 35 50 located at different levels in the chip 5. The location and number of vias are arbitrary. FIG. 4 shows the second or top set of micro pipes 50 being orthogonal to the first or lower set of micro pipes 35. However, any desired configuration may be formed such as both the top and lower micro pipes being parallel to each other. In addition, the micro pipes within each layer may or may not be parallel to each other.

Figure 5:
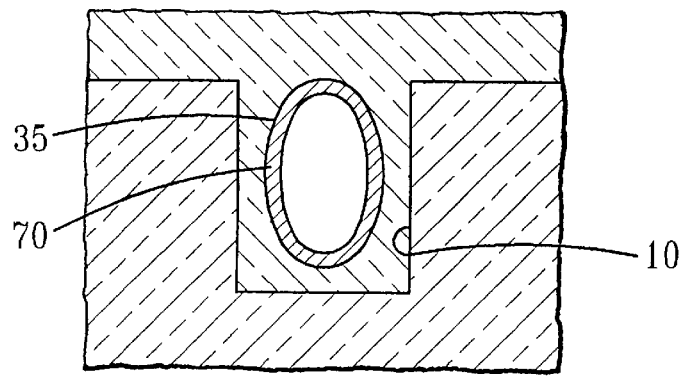
FIG. 5 shows a cross section of a micro pipe having an inner surface which is lined with a material according to the present invention.

In another embodiment, shown in FIG. 5, the inner surface of the micro pipes may be coated with a desired material 70. This is achieved by placing the entire structure, e.g. after forming the via holes, in a CVD or PECVD system to line the micro pipes and via holes with the desired material 70. Illustratively, the material that lines the micro pipes and vias is a metallic conducting material. Additional material may be formed by CVD or PECVD on the inner surfaces of the micro pipes and/or vias. This results in vias and micro pipes coated on the inner surfaces by a series of layers, such as a series of conductive films.

Such micro pipes may be used as a light pipe system or a high surface area catalytic reaction surface. The pipes become buried conductor elements which could be contacted at their upper surface. Alternatively, the buried micro pipes may be contacted at their sides, in the case where the micro pipes extend through the entire chip, or in the case where the micro pipe sides are revealed by cutting or dicing.

Annealing may be performed after forming multiple layers on the inner surface of each micro pipe. The annealing may form new material resulting from a reaction of the different material lining the micro pipes. This results in a composite liner formed on the inner surfaces of the micro pipes.

Coolant material may be circulated within the micro pipes to cool the substrate or chip. In addition, lining micro pipe inner surfaces, or filling the micro pipes with conductive material forms buried contact lines or pipes. Forming the micro pipes in a controlled fashion in accordance with the invention is cost effective, and transforms what would have been defects into useful micro pipes. The inventive method forms internal single or multi layers of micro pipes that are an integral part of a chip or any other suitable substrate.

While the invention has been particularly shown and described with respect to illustrative and preferred embodiments thereof, it will be understood by those skilled in the art that the foregoing and other changes in form and details may be made therein without departing from the spirit and scope of the invention which should be limited only by the scope of the appended claims.

Claims Having thus described our invention, what we claim as new, and desire to secure by letters patent is:

1. A method of forming a micro pipe on a substrate, comprising the steps of:

forming a trench in a first layer on a surface of said substrate;

forming a second layer over said first layer, said trench having a height which is larger than a width thereof so that said second layer lines sidewalls and bottom of said trench and covers a top of said trench to form said micro pipe within said trench; and forming a via hole in said second layer that reaches said micro pipe.

2. The method of claim 1, wherein said trench forming step is reactive ion etching.

3. The method of claim 1, wherein said second layer forming step is one of chemical vapor deposition and plasma enhanced chemical vapor deposition.

4. The method of claim 1 further comprising forming a third layer on inner surfaces of said micro pipe.

5. The method of claim 4, wherein said second layer forming step is one of chemical vapor deposition and plasma enhanced chemical vapor deposition.

6. The method of claim 1 further comprising planarizing said second layer.

7. The method of claim 6, wherein said second layer planarizing step is one of chemical mechanical polish and reactive ion etching.

8. The method of claim 1 further comprising the steps of:

forming a third layer on said second layer;

forming another trench in said third layer; and forming a fourth layer on said third layer, said fourth layer having another micro pipe in said other trench.

9. The method of claim 1 further comprising the steps of:

forming another trench in said second layer; and forming a third layer on said second layer so as to form another micro pipe in said other trench.

10. The method of claim 8 further comprising forming in said fourth layer a via hole that reaches said other micro pipe.

11. The method of claim 8 further comprising forming in said second, third, and fourth layers a via hole that reaches said micro pipes in said second and fourth layers.

12. The method of claim 8, wherein said other micro pipe forming steps forms said other micro pipe to be perpendicular to said micro pipe in said second layer.

* * * * *